United States Patent
Choi (10) Patent No.: US 9,343,137 B2
(45) Date of Patent: *May 17, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Young Geun Choi, Icheon-si (KR)

(73) Assignee: SK HYNIX INC., Icheon-Si (KR)

(*) Notice: Subject to any disclaimer, the term of this patent is extended or adjusted under 35 U.S.C. 154(b) by 41 days.

This patent is subject to a terminal disclaimer.

(21) Appl. No.: 14/497,420

(22) Filed: Sep. 26, 2014

(65) Prior Publication Data

US 2015/0380074 A1   Dec. 31, 2015

(30) Foreign Application Priority Data

Jun. 30, 2014 (KR) .......................... 10-2014-0080468

(51) Int. Cl.
| | |
|---|---|
| *G11C 7/00* | (2006.01) |
| *G11C 11/4091* | (2006.01) |
| *G11C 7/04* | (2006.01) |
| *G11C 7/08* | (2006.01) |
| *G11C 11/4074* | (2006.01) |

(52) U.S. Cl.
CPC .............. *G11C 11/4091* (2013.01); *G11C 7/04* (2013.01); *G11C 7/08* (2013.01); *G11C 11/4074* (2013.01)

(58) Field of Classification Search
CPC ..................... G11C 11/4074; G11C 11/40626; G11C 11/408; G11C 8/08; G11C 11/4078; G11C 11/4085; G11C 11/4091
USPC .......................... 365/205, 211, 222, 189.011
See application file for complete search history.

(56) References Cited

U.S. PATENT DOCUMENTS

| | | |
|---|---|---|
| 2006/0039218 A1 | 2/2006 | Takemura et al. |
| 2015/0348611 A1* | 12/2015 | Rim ................. G11C 11/40626 365/222 |

FOREIGN PATENT DOCUMENTS

| | | |
|---|---|---|
| KR | 1020080080696 A | 9/2008 |
| KR | 1020140006219 A | 1/2014 |

* cited by examiner

*Primary Examiner* — Fernando Hidalgo
(74) *Attorney, Agent, or Firm* — William Park & Associates Ltd.

(57) ABSTRACT

The semiconductor memory device includes a power control signal generator and a sense amplifier circuit. The power control signal generator generates a first power control signal that is enabled in response to a temperature latch signal generated in response to latching a temperature signal in a predetermined mode. The sense amplifier circuit generates a first power signal having a first drive voltage in response to the first power control signal. In addition, the sense amplifier circuit senses and amplifies a voltage level of a bit line using the first power signal as a power supply voltage.

21 Claims, 10 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0080468, filed on Jun. 30, 2014, in the Korean Intellectual Property Office, which is incorporated herein by reference in its entirety as set forth in full.

BACKGROUND

1. Technical Field

Embodiments relate to semiconductor devices and semiconductor systems including the same.

2. Related Art

A semiconductor memory device, such as for example a dynamic random access memory (DRAM) device, typically includes a plurality of memory cells, a plurality of word lines and a plurality of bit lines. Each of the DRAM memory cells is configured to include a single cell transistor and a single cell capacitor. Each of the plurality of DRAM memory cells may be disposed at a junction of an associated word line and bit line.

When a DRAM device operates in a read mode, a word line may be selectively enabled to transfer electric charge stored in the cell capacitors of the DRAM cells that are electrically coupled to the selected word line and onto the associated bit lines.

SUMMARY

An embodiment of a semiconductor device includes a power control signal generator and a sense amplifier circuit. The power control signal generator generates a first power control signal that is enabled in response to a temperature latch signal generated in response to latching a temperature signal in a predetermined mode. The sense amplifier circuit generates a first power signal having a first drive voltage in response to the first power control signal. The sense amplifier circuit senses and amplifies a voltage level of a bit line using the first power signal as a power supply voltage.

An embodiment of a semiconductor device includes a mode signal generator suitable for generating an enabled mode signal in response to command signals and address signals in a predetermined mode, a temperature signal generator suitable for generating a temperature signal based on a temperature code signal in response to the mode signal, a power control signal generator suitable for generating a first power control signal in response to the temperature signal and a sense amplifier circuit suitable for generating a first power signal having a first drive voltage in response to the first power control signal and suitable for sensing and amplifying a voltage level of a bit line using the first power signal as a power supply voltage.

An embodiment of a semiconductor system includes a controller and a semiconductor device. The controller generates command signals, address signals and a temperature signal. The semiconductor device generates a mode signal in response to the command signals and the address signals, generates a first power control signal in response to the mode signal and the temperature signal, and senses and amplifies a voltage level of a bit line using a first power signal having a first drive voltage based on a use of the first power control signal as a power supply voltage.

DETAILED DESCRIPTION OF THE EMBODIMENTS

Various embodiments will be described with reference to the accompanying drawings. The embodiments described herein are for illustrative purposes.

Figure 1:
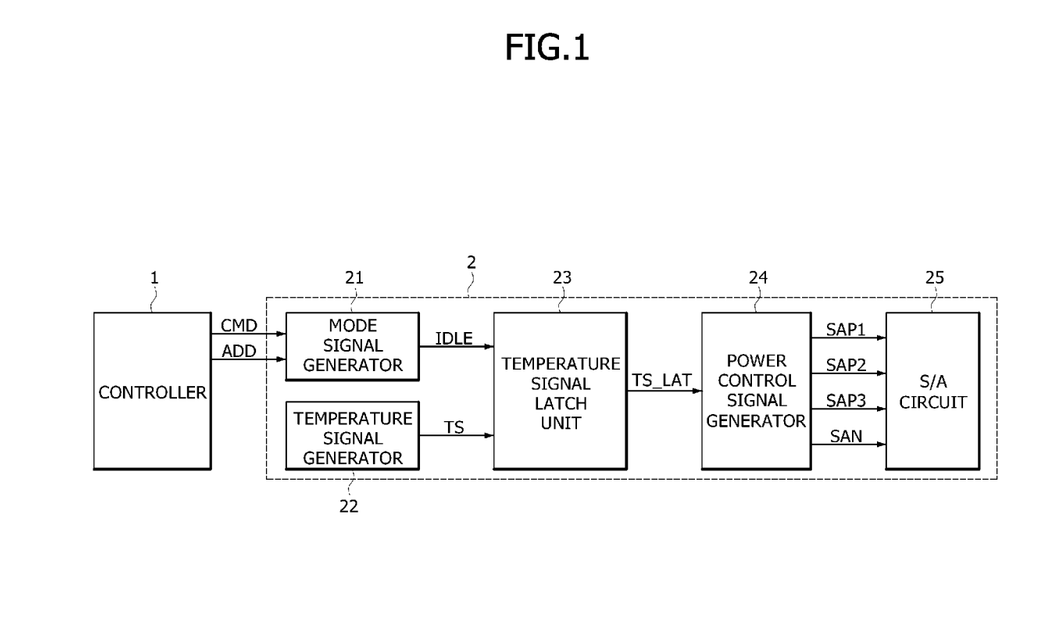
FIG. 1 is a block diagram representation of an embodiment of a semiconductor system.

As illustrated in FIG. 1, an embodiment of a semiconductor system may include a controller 1 and a semiconductor device 2. The semiconductor device 2 may include a mode signal generator 21, a temperature signal generator 22, a temperature signal latch unit 23, a power control signal generator 24 and a sense amplifier (S/A) circuit 25.

The controller 1 may generate command signals CMD and address signals ADD and may transmit the command signals CMD and the address signals ADD to the semiconductor device 2. In an embodiment, the command signals CMD and the address signals ADD may be transmitted to the semiconductor device 2 via common transmission lines (not shown) or via a command signal transmission line and address signal transmission lines (not shown), respectively.

The mode signal generator 21 may receive the command signals CMD and the address signals ADD as input and responsively output a mode signal IDLE. The mode signal IDLE may be a signal that is enabled when an active operation is not applied to all of the banks (not shown) in semiconductor device 2. In an embodiment, a logic level of the enabled mode signal IDLE may be set to have a logic "high" level. In an embodiment a logic level of the enabled mode signal IDLE may be set to have a logic "low" level. In an embodiment, the mode signal IDLE may be enabled to a power down mode to reduce a power consumption or to various other operation modes of the semiconductor device 2.

The temperature signal generator 22 may generate a temperature signal TS having a logic level based on an internal temperature of the semiconductor device 2. The temperature signal TS may change from one logic level to another at a predetermined temperature. For example, the temperature signal TS may have a logic "high" level when the internal temperature of the semiconductor device 2 is greater than approximately 45 degrees Celsius and may have a logic "low" level when the internal temperature is lower than approximately 45 degrees Celsius.

The temperature signal latch unit 23 may generate a temperature latch signal TS_LAT in response to the mode signal IDLE and the temperature signal TS. The temperature signal latch unit 23 may buffer the temperature signal TS to generate the temperature latch signal TS_LAT when the mode signal IDLE is enabled and may latch the temperature latch signal TS_LAT when the mode signal IDLE is disabled.

The power control signal generator 24 may generate a first power control signal SAP1, a second power control signal SAP2, a third power control signal SAP3 and a fourth power control signal SAN according to the temperature latch signal TS_LAT. The power control signal generator 24 may generate an enabled third power control signal SAP3 according to the temperature latch signal TS_LAT. More specifically, the power control signal generator 24 may generate an enabled the third power control signal SAP3 for a predetermined period of time when the temperature latch signal TS_LAT has a logic "high" level. The temperature latch signal TS_LAT may have a logic "high" level when the internal temperature is greater than the predetermined temperature. The power control signal generator 24 may generate a disabled third power control signal SAP3 when the temperature latch signal TS_LAT has a logic "low" level. The temperature latch signal TS_LAT may have a logic "high" level when the internal temperature is lower than the predetermined temperature. In an embodiment, the power control signal generator 24 may be configured to enable one of the first, second and fourth power control signals SAP1, SAP2, SAN according to variations in the internal temperature of the semiconductor device 2. In an embodiment, the power control signal generator 24 may be configured to enable at least two of the first, second, third and fourth power control signals SAP1, SAP2, SAP3, SAN according to variations in the internal temperature of the semiconductor device 2.

The S/A circuit 25 may sense and amplify a level difference between a bit line (BL of FIG. 5) and a complementary bit line (BLB of FIG. 5) in response to the first, second, third and fourth power control signals SAP1, SAP2, SAP3, SAN. The first, second and third power control signals SAP1, SAP2, SAP3 may control a level of a first power signal (RTO of FIG. 5) that is supplied to a bit line S/A (252 of FIG. 5) in the S/A circuit 25. The fourth power control signal SAN may control a level of a second power signal (SB of FIG. 5) that is supplied to the bit line S/A 252 in the S/A circuit 25. As described above, the third power control signal SAP3 supplied to the sense amplifier circuit 25 may be enabled when the internal temperature is greater than the predetermined temperature and may be disabled when the internal temperature is lower than the predetermined temperature.

Figure 2:
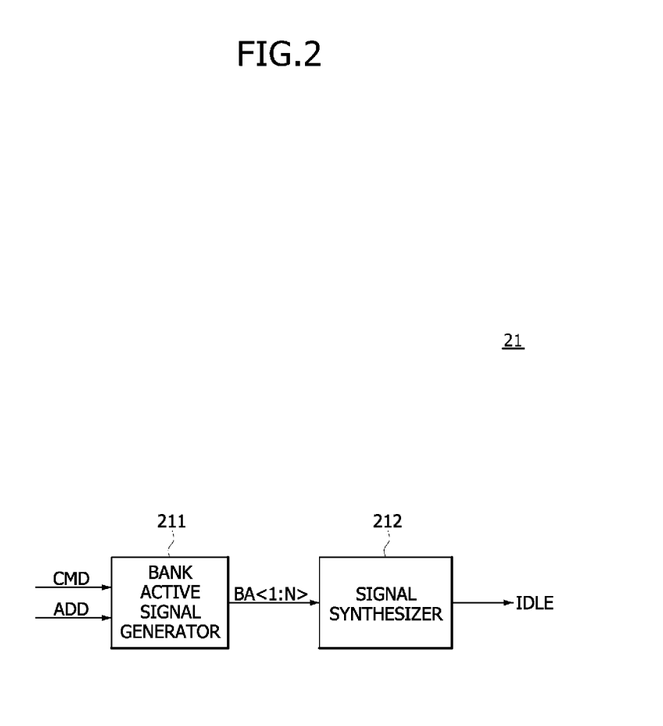
FIG. 2 is a block diagram representation of an embodiment of a mode signal generator included in the semiconductor system of FIG. 1.

Referring to FIG. 2, the mode signal generator 21 may include a bank active signal generator 211 and a signal synthesizer 212.

The bank active signal generator 211 may receive the command signals CMD and the address signals ADD to generate a first to Nth bank active signals BA<1:N>. The bank active signal generator 211 may generate the first to Nth bank active signals BA<1:N> that are selectively enabled according to a level combination of the command signals CMD and the address signals ADD. When the third bank active signal BA<3> of the first to eighth bank active signals BA<1:8> is enabled according to a level combination of the command signals CMD and the address signals ADD, the memory cells in the third bank (not shown) of eight banks (not shown) in the semiconductor device 2 may be selected and accessed. The logic levels of the first to Nth bank active signals BA<1:N> may be set to be enabled differently in different embodiments.

The signal synthesizer 212 may receive the first to Nth bank active signals BA<1:N> to generate the mode signal IDLE. The signal synthesizer 212 may generate an enable mode signal IDLE when all of the first to Nth bank active signals BA<1:N> are disabled. A active operation of "N" banks (not shown) in the semiconductor device 2 may not execute when all of the first to Nth bank active signals BA<1:N> are disabled.

Figure 3:
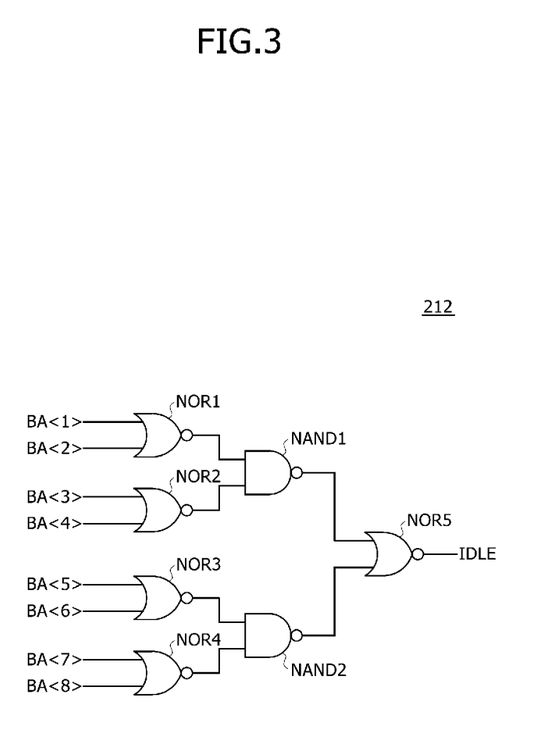
FIG. 3 is a block diagram representation of an embodiment of a signal synthesizer included in the mode signal generator of FIG. 1.

Referring to FIG. 3, the signal synthesizer 212 may include first, second, third, fourth and fifth NOR gates NOR1, NOR2, NOR3, NOR4, NOR5 and first and second NAND gates NAND1, NAND2. The first NOR gate NOR1 may receive the first bank active signal BA<1> and the second bank active signal BA<2> to execute a NOR operation. The second NOR gate NOR2 may receive the third bank active signal BA<3> and the fourth bank active signal BA<4> to execute a NOR operation. The third NOR gate NOR3 may receive the fifth bank active signal BA<5> and the sixth bank active signal BA<6> to execute a NOR operation. The fourth NOR gate NOR4 may receive the seventh bank active signal BA<7> and the eighth bank active signal BA<8> to execute a NOR operation. The first NAND gate NAND1 may receive an output signal of the first NOR gate NOR1 and an output signal of the second NOR gate NOR2 to execute a NAND operation. The second NAND gate NAND2 may receive an output signal of the third NOR gate NOR3 and a output signal of the fourth NOR gate NOR4 to execute a NAND operation. The fifth NOR gate NOR5 may receive an output signal of the first NAND gate NAND1 and an output signal of the second NAND gate NAND2 to execute a NOR operation and generate the mode signal IDLE as an output. The signal synthesizer 212 may generate the mode signal IDLE enabled to have a logic "high" level when all of the first to eighth bank active signals BA<1:8> are disabled to have a logic "low" level. The signal synthesizer 212 may generate the mode signal IDLE disabled to have a logic "low" level when at least one of the first to eighth bank active signals BA<1:8> are enabled to have a logic "high" level. In other embodiments, a circuit of the signal synthesizer 212 may have greater than or fewer than eight banks and there may be variations in the logic operation based on the number of banks.

Figure 4:
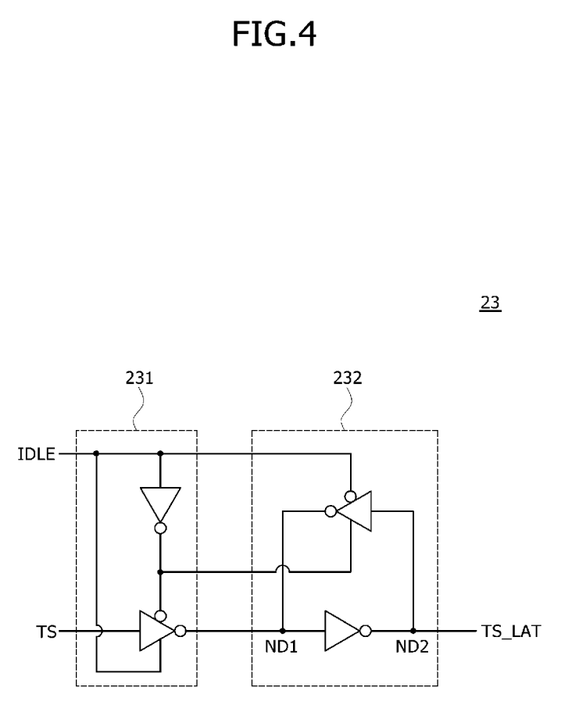
FIG. 4 is a circuit diagram representation of an embodiment of a temperature signal latch unit included in the semiconductor system of FIG. 1.

Referring to FIG. 4, the temperature signal latch unit 23 may include a select transmitter 231 and a latch unit 232. The select transmitter 231 may transmit the temperature signal TS to a first node ND1 when the mode signal IDLE is enabled to have a logic "high" level. The select transmitter 231 may terminate transmission of the temperature signal TS to the first node ND1 when the mode signal IDLE is disabled to have a logic "low" level. The latch unit 232 may inversely buffer a signal at the first node ND1 to generate the temperature latch signal TS_LAT. The latch unit 232 may latch the signal at the first node ND1 and a signal at a second node ND2 when the mode signal IDLE is disabled to have a logic "low" level. In other embodiments, alternative configurations of the temperature signal latch unit 23 used to generate the temperature latch signal TS_LAT in response to the mode signal IDLE and to latch the temperature latch signal TS_LAT may be used.

Figure 5:
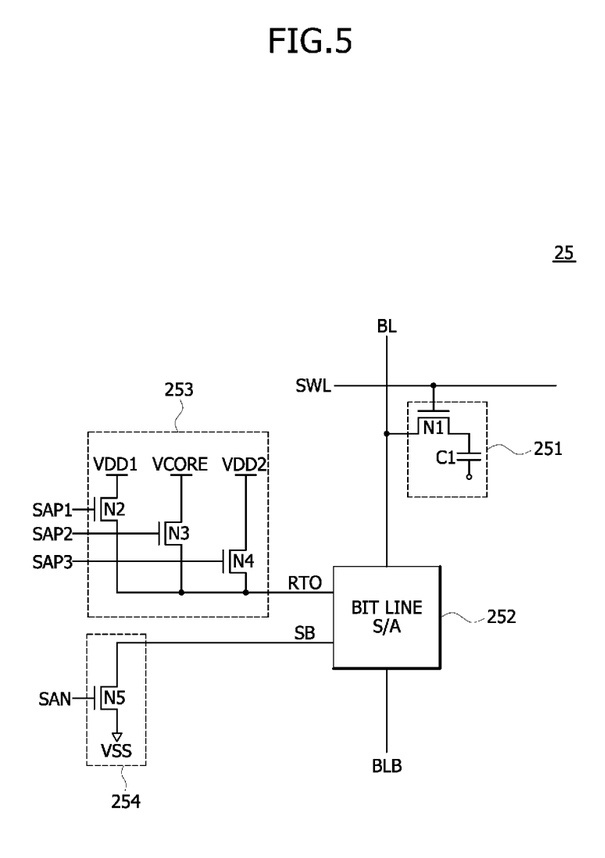
FIG. 5 is a block diagram representation of an embodiment of a sense amplifier circuit included in the semiconductor system of FIG. 1.

Referring to FIG. 5, the S/A circuit 25 may include a memory cell 251, a bit line S/A 252, a first power signal driver 253 and a second power signal driver 254.

The memory cell 251 may include a first cell transistor N1 (e.g., an NMOS transistor) and a first cell capacitor C1 electrically coupled to a source of the first cell transistor N1. If a word line SWL electrically coupled to a gate of the first cell transistor N1 is selectively enabled to have a logic "high" level while the refresh operation is executed, the first cell transistor N1 may be turned on and may cause a charge sharing phenomenon between the first cell capacitor C1 and the bit line BL that is electrically coupled to a drain of the first cell transistor N1. The word line SWL may be selected while an active operation, such as for example the read operation or the write operation, is being executed.

The bit line S/A 252 may receive the first power signal RTO and the second power signal SB to sense and amplify a voltage level difference between the bit line BL and the complementary bit line BLB. More specifically, the bit line S/A 252 may sense a voltage difference generated between the bit line BL and the complementary bit line BLB due to the charge sharing phenomenon and may amplify the voltage difference between the bit line BL and the complementary bit line BLB.

The first power signal driver 253 may include first, second and third NMOS transistors N2, N3, N4. The first, second and third NMOS transistors N2, N3, N4 may be configured to drive the first power signal RTO in response to the first, second and third power control signals SAP1, SAP2, SAP3. The first NMOS transistor N2 may be turned on to drive the first power signal RTO to a first drive voltage VDD1 while the first power control signal SAP1 is enabled to have a logic "high" level. The second NMOS transistor N3 may be turned on to drive the first power signal RTO to a second drive voltage VCORE while the second power control signal SAP2 is enabled to have a logic "high" level. The third NMOS transistor N4 may be turned on to drive the first power signal RTO to a third drive voltage VDD2 while the third power control signal SAP3 is enabled to have a logic "high" level. In an embodiment, the third drive voltage VDD2 may have a relatively higher voltage level than the first drive voltage VDD1 and the first drive voltage VDD1 may have a relatively higher voltage level than the second drive voltage VCORE. The first, second and third drive voltages VDD1, VCORE, VDD2 may be set to have different voltage levels in different embodiments.

The second power signal driver 254 may include a fourth NMOS transistor N5 that drives the second power signal SB in response to the fourth power control signal SAN. The fourth NMOS transistor N5 may be turned on to drive the second power signal SB to a ground voltage VSS while the fourth power control signal SAN is enabled to have a logic "high" level.

An operation of an embodiment of the semiconductor system having the aforementioned configuration will be described with reference to FIG. 6 and FIG. 7.

Figure 6:
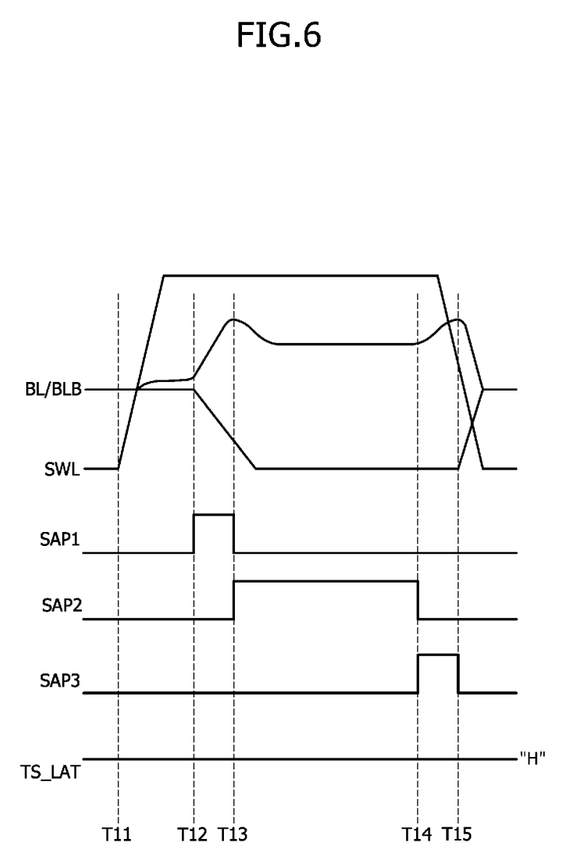
FIG. 6 and FIG. 7 are timing diagrams illustrating an operation of an embodiment of the semiconductor system shown in FIG. 1.

As illustrated in FIG. 6, at a time "T11", if the word line SWL is enabled to have a logic "high" level, a voltage difference may be generated between the bit line BL and the complementary bit line BLB due to a charge sharing phenomenon. The voltage difference may be a relatively small voltage difference. During a first time period extending from a time "T12" till a time "T13", the first power control signal SAP1 may be enabled to have a logic "high" level to drive the first power signal RTO to the first drive voltage VDD1. The bit line S/A 252 to which the first power signal RTO is supplied may sense and amplify a voltage difference between the bit line BL and the complementary bit line BLB. The first drive voltage VDD1 may be a power supply voltage that is supplied from an external device or an external system to execute an over driving operation. During a second time period extending the time "T13" till a time "T14", the second power control signal SAP2 may be enabled to have a logic "high" level to drive the first power signal RTO to the second drive voltage VCORE. The bit line S/A 252 to which the first power signal RTO is supplied may sense and amplify a voltage difference between the bit line BL and the complementary bit line BLB. The second drive voltage VCORE may be an internal voltage that is supplied to a memory cell array region (not shown). During a third time period extending from the time "T14" till a time "T15", the first power signal RTO may be driven to the third drive voltage VDD2 because the third power control signal SAP3 is enabled to have a logic "high" level when the temperature latch signal TS_LAT has a logic "high" level. The bit line S/A 252 to which the first power signal RTO is supplied may sense and amplifier a voltage difference between the bit line BL and the complementary bit line BLB. The third drive voltage VDD2 may be a power supply voltage that is supplied from an external device or an external system to execute an over driving operation.

Figure 7:
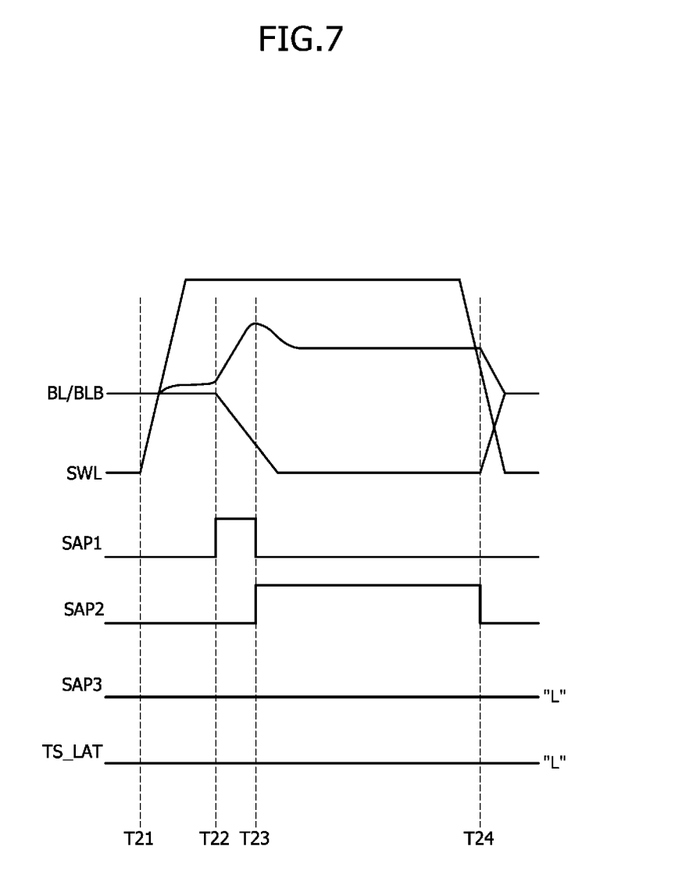

As illustrated in FIG. 7, at a time "T21", if the word line SWL is enabled to have a logic "high" level, a voltage difference may be generated between the bit line BL and the complementary bit line BLB due to a charge sharing phenomenon. The voltage difference may be a relatively small voltage difference. During a fourth time period extending from a time "T22" till a time "T23", the first power control signal SAP1 may be enabled to have a logic "high" level to drive the first power signal RTO to the first drive voltage VDD1. The bit line S/A 252 to which the first power signal RTO is supplied may sense and amplify a voltage difference between the bit line BL and the complementary bit line BLB. The first drive voltage VDD1 may be a power supply voltage that is supplied from an external device or an external system to execute an over driving operation. During a fifth time period extending from the time "T23" till a time "T24", the second power control signal SAP2 may be enabled to have a logic "high" level to drive the first power signal RTO to the second drive voltage VCORE. The bit line S/A 252 to which the first power signal RTO is supplied may sense and amplify a voltage difference between the bit line BL and the complementary bit line BLB. The first power signal RTO may not be driven to the third drive voltage VDD2 because the third power control signal SAP3 is disabled to have a logic "low" level when the temperature latch signal TS_LAT has a logic "low" level.

As described above, an embodiment of the semiconductor system may drive the first power signal RTO supplied to the bit line S/A 252 to the third drive voltage VDD2 according to the internal temperature of the semiconductor device 2. That is, the semiconductor system may drive the first power signal RTO to the third drive voltage VDD2 when the internal temperature of the semiconductor device 2 is relatively higher than the predetermined temperature. An embodiment of the semiconductor system may not drive the first power signal RTO to the third drive voltage VDD2 when the internal temperature of the semiconductor device 2 is relatively lower than the predetermined temperature. This may result in a reduction in power consumption. A data retention time of a memory cell may be increased as the internal temperature of the semiconductor device 2 is lowered. The bit line S/A 252 can sense and amplify the bit line BL and the complementary bit line BLB without the over driving operation when the internal temperature of the semiconductor device 2 is relatively lower than the predetermined temperature. The temperature signal TS may be updated when an active operation is not applied to all of the banks (not shown) in semiconductor device 2. There may be reductions in the number of malfunctions because the temperature signal TS is not updated during the execution of bit line S/A 252.

Figure 8:
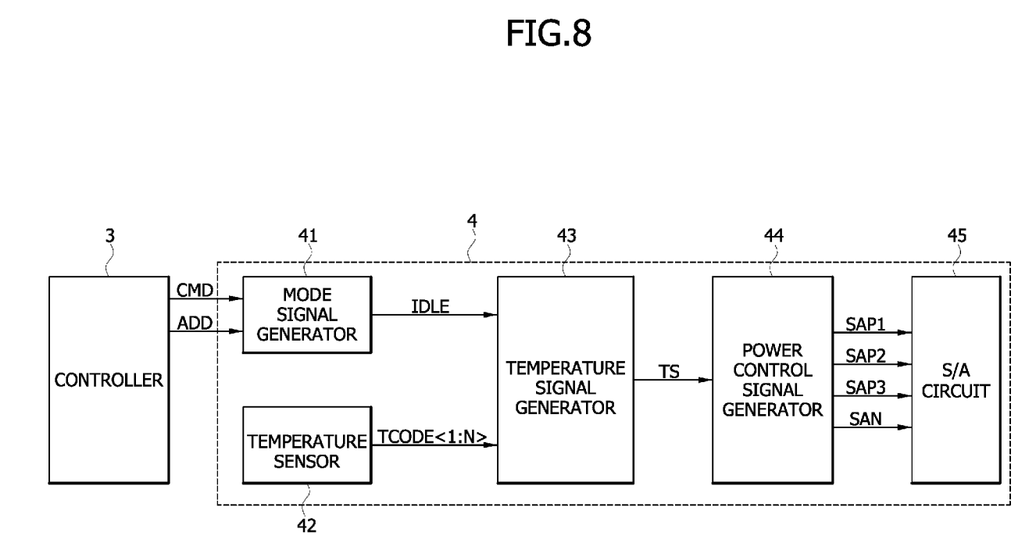
FIG. 8 is a block diagram representation of an embodiment of a semiconductor system.

As illustrated in FIG. 8, an embodiment of a semiconductor system may include a controller 3 and a semiconductor device 4. The semiconductor device 4 may include a mode signal generator 41, a temperature sensor 42, a temperature signal generator 43, a power control signal generator 44 and a sense amplifier (S/A) circuit 45.

The controller 3 may generate command signals CMD and address signals ADD and may transmit the generated command signals CMD and the address signals ADD to the semiconductor device 4. The command signals CMD and the address signals ADD may be transmitted to the semiconductor device 4 via common transmission lines (not shown) or via respective transmission lines (not shown).

The mode signal generator 41 may receive the command signals CMD and the address signals ADD as inputs and responsively generate a mode signal IDLE. The mode signal IDLE may be enabled when an active operation is not applied to all banks (not shown) in semiconductor device 4. In an embodiment, a logic level of the enabled mode signal IDLE may have a logic "high" level. In an embodiment, a logic level of the enabled mode signal IDLE may have a logic "low" level. In an embodiment, the mode signal IDLE may be enabled to a power down mode and may reduce a power consumption. In an embodiment, the mode signal IDLE may be enabled to other operation modes of the semiconductor device 4.

The temperature sensor 42 may generate temperature code signals TCODE<1:N> including information on an internal temperature of the semiconductor device 4. The temperature code signals TCODE<1:N> may have different logic level combinations corresponding to different ranges of the internal temperatures. For example, the temperature code signals TCODE<1:2> may have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:2> have a logic level combination of "01", the temperature code signal TCODE<1> may have a logic "high (1)" level and the temperature code signal TCODE<2> may have a logic "low(0)" level. If the temperature code signals TCODE<1:N> have a logic level combination of "10", the temperature code signal TCODE<1> may have a logic "low (0)" level and the temperature code signal TCODE<2> may have a logic "high(1)" level. The number "N" of bits of the temperature code signals TCODE<1:N> and the logic level combinations of the temperature code signals TCODE<1:N> corresponding to the different ranges of internal temperatures may vary in different embodiments.

The temperature signal generator 43 may generate a temperature signal TS in response the mode signal IDLE and the temperature code signals TCODE<1:N>. The temperature signal TS may change a logic levels based on predetermined temperature settings. For example, the temperature signal TS may have a logic "high" level when the internal temperature is higher than 45 degrees Celsius and may have a logic "low" level when the internal temperature is lower than 45 degrees Celsius. The temperature signal generator 43 may generate the temperature signal TS based on the temperature code signals TCODE<1:N> when the mode signal IDLE is enabled. The temperature signal generator 43 may latch the temperature signal TS when the mode signal IDLE is disabled.

The power control signal generator 44 may generate a first power control signal SAP1, a second power control signal SAP2, a third power control signal SAP3 and a fourth power control signal SAN according to the temperature signal TS.

The power control signal generator 44 may generate the third power control signal SAP3 as an enabled signal according to the temperature signal TS. More specifically, the power control signal generator 44 may generate the third power control signal SAP3 as an enabled signal during the predetermined time period based on the temperature signal TS having a logic "high" level when the internal temperature is relatively higher than the predetermined temperature. The power control signal generator 44 may generate the third power control signal SAP3 as a disabled signal based on the temperature latch signal TS_LAT having a logic "low" level when the internal temperature is relatively lower than the predetermined temperature. In an embodiment, the power control signal generator 44 may be configured to enable one of the first, second and fourth power control signals SAP1, SAP2 SAN according to variations in the internal temperature of the semiconductor device 4. In an embodiment, the power control signal generator 44 may be configured to enable at least two signals from among the first, second, third and fourth power control signals SAP1, SAP2, SAP3, SAN according to variations in the internal temperature of the semiconductor device 4.

The S/A circuit 45 may sense and amplify a voltage level difference between a selected bit line (not shown) and a selected complementary bit line (not shown) in response to the first, second, third and fourth power control signals SAP1, SAP2, SAP3, SAN. The third power control signal SAP3 supplied to the S/A circuit 45 may be enabled when the internal temperature is relatively higher than the predetermined temperature and may be disabled when the internal temperature is relatively lower than the predetermined temperature.

The semiconductor system illustrated in FIG. 8 may drive the first power signal RTO to the third drive voltage VDD2, according to the internal temperature. Unlike the semiconductor system shown in FIG. 1, the semiconductor system illustrated in FIG. 8 may control the driving of the third power control signal SAP3 using the temperature code signals TCODE<1:N>.

In an embodiment, the semiconductor system may drive the first power signal RTO supplied to the S/A circuit 45 to the third drive voltage VDD2 according to the internal temperature of the semiconductor device 4. An embodiment of the semiconductor system may drive the first power signal RTO to the third drive voltage VDD2 when the internal temperature of the semiconductor device 4 is relatively higher than the predetermined temperature. In an embodiment, the semiconductor system may not drive the first power signal RTO to the third drive voltage VDD2 when the internal temperature of the semiconductor device 4 is relatively lower than the predetermined temperature. This may result in a reduction in power consumption. A data retention time of the memory cell may be increased as the internal temperature of the semiconductor device 4 is lowered. The S/A circuit 45 can sense and amplify the bit line BL and the complementary bit line BLB without the overdriving operation when the internal temperature of the semiconductor device 4 is relatively lower than the predetermined temperature. The temperature latch signal TS_LAT may be updated when an active operation is not being applied to all of the banks (not shown) in semiconductor device 4. Malfunction may be reduced because the temperature latch signal TS_LAT is not updated during execution of the S/A circuit 45.

Figure 9:
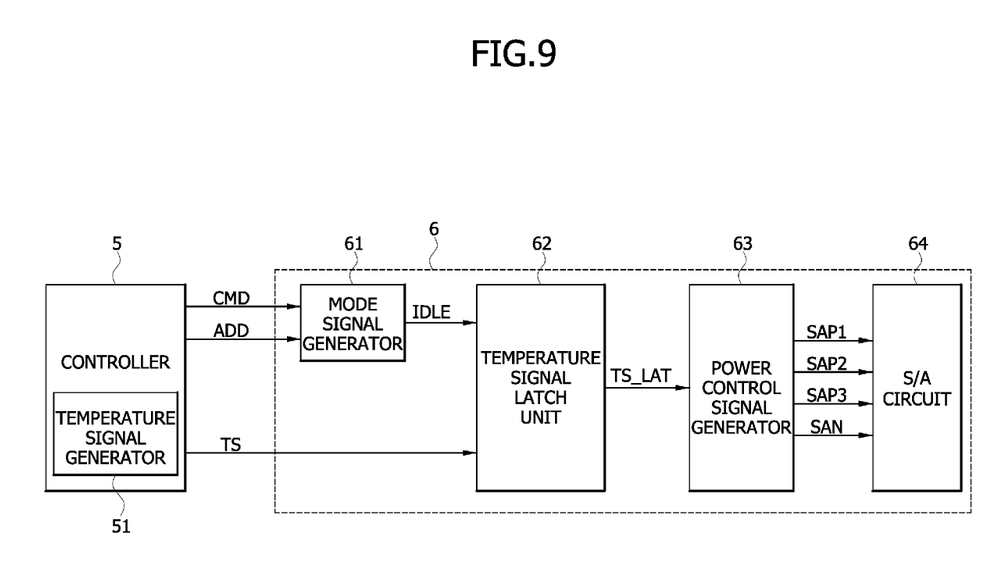
FIG. 9 is a block diagram representation of an embodiment of a semiconductor system.

As illustrated in FIG. 9, an embodiment of a semiconductor system may include a controller 5 and a semiconductor device 6. The semiconductor device 6 may include a mode signal generator 61, a temperature signal latch unit 62, a power control signal generator 63 and a sense amplifier (S/A) circuit 64.

The controller 5 may generate command signals CMD, address signals ADD and a temperature signal TS. The controller 5 may transmit the generated command signals CMD, address signals ADD and temperature signal TS to the semiconductor device 6. The command signals CMD and the address signals ADD may be transmitted to the semiconductor device 6 via common transmission lines (not shown) or via respective transmission lines (not shown). The controller 5 may include a temperature signal generator 51. The temperature signal generator 51 may generate a temperature signal TS a having a level based on an internal temperature. The temperature signal TS may change a logic level based on a predetermined internal temperature value. For example, the temperature signal TS may have a logic "high" level when the internal temperature is higher than 45 degrees Celsius and may have a logic "low" level when the internal temperature is lower than 45 degrees Celsius.

The mode signal generator 61 may receive the command signals CMD and the address signals ADD as inputs and responsively generate a mode signal IDLE. The mode signal IDLE may be enabled when an active operation is not applied to all of the banks (not shown) in the semiconductor device 6. In an embodiment, a logic level of the enabled mode signal IDLE may have a logic "high" level. In an embodiment, a logic level of the enabled mode signal IDLE may have a logic "low" level. In an embodiment, the mode signal IDLE may be enabled to a power down mode and may reduce power consumption. In an embodiment, the mode signal IDLE may be enabled to other operation modes of the semiconductor device 6.

The temperature signal latch unit 62 may generate a temperature latch signal TS_LAT in response the mode signal IDLE and the temperature signal TS. The temperature signal latch unit 62 may buffer the temperature signal TS to generate the temperature latch signal TS_LAT when the mode signal IDLE is enabled and may latch the temperature latch signal TS_LAT when the mode signal IDLE is disabled.

The power control signal generator 63 may generate a first power control signal SAP1, a second power control signal SAP2, a third power control signal SAP3 and a fourth power control signal SAN according to the temperature latch signal TS_LAT. The power control signal generator 63 may generate the third power control signal SAP3 that is enabled according to the temperature latch signal TS_LAT. More specifically, the power control signal generator 63 may generate the third power control signal SAP3 as an enabled signal during a predetermined period in response to the temperature latch signal TS_LAT having a logic "high" level when the internal temperature is relatively higher than a predetermined temperature. The power control signal generator 63 may generate the third power control signal SAP3 as a disabled signal in response to the temperature latch signal TS_LAT having a logic "low" level when the internal temperature is relatively lower than a predetermined temperature. In an embodiment, the power control signal generator 63 may be configured to enable one of the first, second and fourth power control signals SAP1, SAP2 SAN based on variations in the internal temperature. In an embodiment, the power control signal generator 63 may be configured to enable at least two of the first, second, third and fourth power control signal SAP1, SAP2, SAP3, SAN based on variations in the internal temperature.

The S/A circuit 64 may sense and amplify a voltage level difference between a selected bit line (not shown) and a selected complementary bit line (not shown) in response to the first, second, third and fourth power control signals SAP1, SAP2, SAP3, SAN. The third power control signal SAP3 supplied to the S/A circuit 64 may be enabled when the internal temperature is relatively higher than the predetermined temperature and may be disabled when the internal temperature is relatively lower than the predetermined temperature.

The semiconductor system illustrated in FIG. 9 may drive the first power signal RTO to the third drive voltage VDD2, according to internal temperature. Unlike the semiconductor system shown in FIG. 1, the temperature signal generator 51 that generates the temperature signal TS may be a component of the controller 5.

In an embodiment, the semiconductor system may drive the first power signal RTO supplied to the S/A circuit 64 to the third drive voltage VDD2 according to the internal temperature of the semiconductor device 6. An embodiment of the semiconductor system may drive the first power signal RTO to the third drive voltage VDD2 when the internal temperature of the semiconductor device 6 is relatively higher than the predetermined temperature. In an embodiment, the semiconductor system may not drive the first power signal RTO to the third drive voltage VDD2 when the internal temperature of the semiconductor device 6 is relatively lower than the predetermined temperature. This may result in a reduction in power consumption. A data retention time of the memory cell may be increased as the internal temperature of the semiconductor device 6 is lowered. The S/A circuit 64 can sense and amplify the bit line BL and the complementary bit line BLB without the over driving operation when the internal temperature of the semiconductor device 6 is relatively lower than the predetermined temperature. The temperature signal TS may be updated when an active operation is not applied to all of the banks (not shown) in semiconductor device 6. Malfunctions may be reduced because the temperature signal TS is not updated during execution of the S/A circuit 64.

Figure 10:
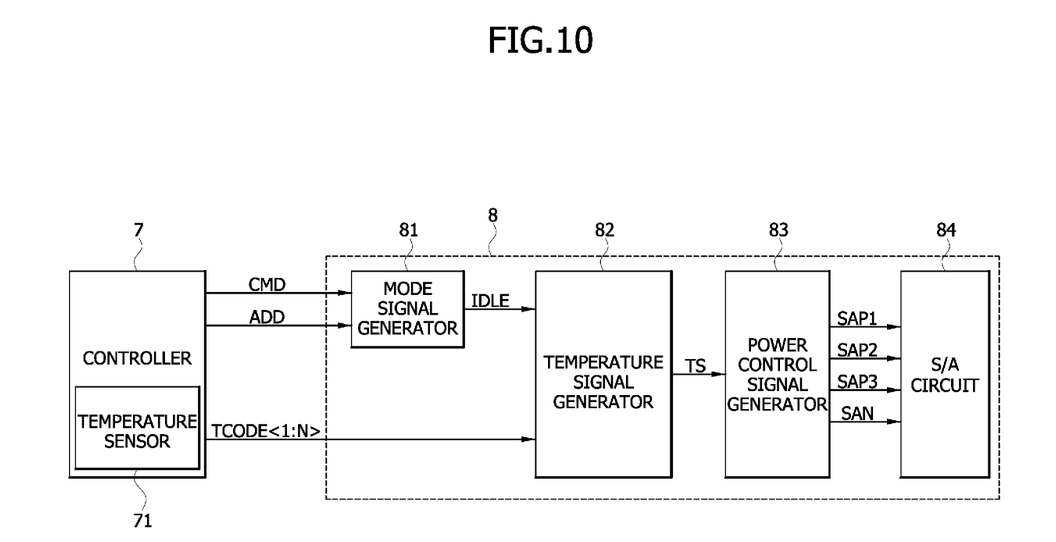
FIG. 10 is a block diagram representation of an embodiment of a semiconductor system.

As illustrated in FIG. 10, an embodiment of a semiconductor system may include a controller 7 and a semiconductor device 8. The semiconductor device 8 may include a mode signal generator 81, a temperature signal generator 82, a power control signal generator 83 and a sense amplifier (S/A) circuit 84.

The controller 7 may generate command signals CMD, address signals ADD and temperature code signals TCODE<1:N>. The controller 7 may transmit the generated command signals CMD, address signals ADD and temperature code signals TCODE<1:N> to the semiconductor device 8. The command signals CMD and the address signals ADD may be transmitted to the semiconductor device 8 via common transmission lines (not shown) or respective transmission lines (not shown). The controller 7 may include a temperature sensor 71. The temperature sensor 71 may generate the temperature code signals TCODE<1:N> including information on an internal temperature. The temperature code signals TCODE<1:N> may have a logic level combination corresponding to one of a number of different ranges of the internal temperature. For example, the temperature code signals TCODE<1:2> may have a logic level combination of "00" if the internal temperature is below 0 degree Celsius, a logic level combination of "01" if the internal temperature is within a range of 0 degree Celsius to 45 degrees Celsius, a logic level combination of "10" if the internal temperature is within a range of 45 degrees Celsius to 90 degrees Celsius, and a logic level combination of "11" if the internal temperature is over 90 degrees Celsius. If the temperature code signals TCODE<1:2> have a logic level combination of "01", the temperature code signal TCODE<1> may have a logic "high(1)" level and the temperature code signal TCODE<2> may have a logic "low(0)" level. If the temperature code signals TCODE<1:2> have a logic level combination of "10", the temperature code signal TCODE<1> may have a logic "low(0)" level and the temperature code signal TCODE<2> may have a logic "high(1)" level. The number "N" of bits of the temperature code signals TCODE<1:N> and the logic level combinations of the temperature code signals TCODE<1:N> corresponding to the various ranges of the internal temperature may vary in different embodiments.

The mode signal generator 81 may receive the command signals CMD and the address signals ADD as inputs and responsively generate a mode signal IDLE. The mode signal IDLE may be enabled when an active operation is not applied to all of the banks (not shown) in semiconductor device 8. In an embodiment, a logic level of the enabled mode signal IDLE may have a logic "high" level. In an embodiment, a logic level of the enabled mode signal IDLE may have a logic "low" level. In an embodiment, the mode signal IDLE may be enabled to a power down mode. This may reduce power consumption. In other embodiments, the mode signal IDLE may be enabled to different operation modes of the semiconductor device 8.

The temperature signal generator 82 may generate a temperature signal TS in response the mode signal IDLE and the temperature code signal TCODE<1:N>. The temperature signal TS may change a logic level to a predetermined internal temperature. For example, the temperature signal TS may have a logic "high" level when the internal temperature is higher than 45 degrees Celsius and have a logic "low" level when the internal temperature is lower than 45 degrees Celsius. The temperature signal generator 82 may generate the temperature signal TS from the temperature code signal TCODE<1:N> when the mode signal IDLE is enabled and may latch the temperature signal TS when the mode signal IDLE is disabled.

The power control signal generator 83 may generate a first power control signal SAP1, a second power control signal SAP2, a third power control signal SAP3 and a fourth power control signal SAN according to the temperature signal TS. The power control signal generator 83 may generate the third power control signal SAP3 that is enabled according to the temperature signal TS. More specifically, the power control signal generator 83 may generate the third power control signal SAP3 as an enabled signal during a predetermined time period based on the temperature signal TS having a logic "high" level when the internal temperature is relatively higher than a predetermined temperature. The power control signal generator 83 may generate the third power control signal SAP3 as a disabled signal based on the temperature latch signal TS_LAT having a logic "low" level when the internal temperature is relatively lower than a predetermined temperature. In an embodiment, the power control signal generator 83 may be configured to enable one of the first, second and fourth power control signals SAP1, SAP2, SAN according to variations in the internal temperature of the semiconductor device 8. In an embodiment, the power control signal generator 83 may be configured to enable at least two signals from among the first, second, third and fourth power control signals SAP1, SAP2, SAP3, SAN based on variations in the internal temperature of the semiconductor device 8.

The S/A circuit 84 may sense and amplify a voltage level difference between a selected bit line (not shown) and a selected complementary bit line (not shown) in response to the first, second, third and fourth power control signals SAP1, SAP2, SAP3, SAN. The third power control signal SAP3 supplied to the S/A circuit 84 may be enabled when the internal temperature is relatively higher than the predetermined temperature and may be disabled when the internal temperature is relatively lower than the predetermined temperature.

The semiconductor system illustrated in FIG. 10 may drive the first power signal RTO to the third drive voltage VDD2 according to internal temperature. Unlike the semiconductor system shown in FIG. 1, the semiconductor system illustrated in FIG. 10 may control the driving of the third power control signal SAP3 using the temperature code signals TCODE<1:N> and the temperature sensor 71 illustrated in FIG. 10 may be included in the controller 7.

In an embodiment, the semiconductor system may drive the first power signal RTO supplied to the S/A circuit 84 to the third drive voltage VDD2 according to the internal temperature of the semiconductor device 8. An embodiment of the semiconductor system may drive the first power signal RTO to the third drive voltage VDD2 when the internal temperature of the semiconductor device 8 is relatively higher than the predetermined temperature. An embodiment of the semiconductor system may not drive the first power signal RTO to the third drive voltage VDD2 when the internal temperature of the semiconductor device 8 is relatively lower than the predetermined temperature. This may result in a reduction in power consumption. A data retention time of the memory cell may be increased as the internal temperature of the semiconductor device 8 is lowered. The S/A circuit 84 can sense and amplify the bit line BL and the complementary bit line BLB without the over driving operation when the internal temperature of the semiconductor device 8 is relatively lower than the predetermined temperature. The temperature signal TS may be updated when an active operation is not applied to all of the banks (not shown) in semiconductor device 8. Malfunction may be reduced because the temperature signal TS is not updated during execution of the S/A circuit 84.

While certain embodiments have been described above, it will be understood to those skilled in the art that the embodiments described are by way of example only. Accordingly, the semiconductor device and semiconductor system including the same described herein should not be limited based on the described embodiments. Rather, the semiconductor device and semiconductor system including the same described herein should only be limited in light of the claims that follow when taken in conjunction with the above description and accompanying drawings.

What is claimed is:

1. A semiconductor device comprising:
 a power control signal generator suitable for generating a first power control signal that is enabled in response to a temperature latch signal generated in response to latching a temperature signal in a predetermined mode; and
 a sense amplifier circuit suitable for generating a first power signal having a first drive voltage in response to the first power control signal and suitable for sensing and amplifying a voltage level of a bit line using the first power signal as a power supply voltage, wherein a level of the temperature signal is changed when an internal temperature is relatively higher than a predetermined temperature.

2. The semiconductor device of claim 1, wherein an active operation is not applied to all banks in the predetermined mode.

3. The semiconductor device of claim 1, wherein the first power control signal is enabled when the temperature signal is at a first logic level and disabled when the temperature signal is at a second logic level.

4. The semiconductor device of claim 1 further comprising:
- a bank active signal generator suitable for generating a bank active signal in response to command signals and address signals; and
- a signal synthesizer suitable for generating an enabled mode signal in the predetermined mode in response to the bank active signal.

5. The semiconductor device of claim 1,
- wherein the sense amplifier circuit is suitable for generating the first power signal having a second drive voltage in response to a second power control signal during a first time period following a selection of a memory cell by a word line;
- wherein the sense amplifier circuit is suitable for generating the first power signal having a third drive voltage in response to a third power control signal during a second time period following an end of the first time period end; and
- wherein the sense amplifier circuit is suitable for generating the first power signal having the first drive voltage in response to the first power control signal during a third time period following an end of the second time period.

6. The semiconductor device of claim 5, wherein the first drive voltage is relatively higher than the second drive voltage and the second drive voltage is relatively higher than the third drive voltage.

7. A semiconductor device comprising:
- a mode signal generator suitable for generating an enabled mode signal in response to command signals and address signals in a predetermined mode;
- a temperature signal generator suitable for generating a temperature signal based on a temperature code signal in response to the mode signal;
- a power control signal generator suitable for generating a first power control signal in response to the temperature signal; and
- a sense amplifier circuit suitable for generating a first power signal having a first drive voltage in response to the first power control signal and suitable for sensing and amplifying a voltage level of a bit line using the first power signal as a power supply voltage, wherein a level of the temperature signal is changed when an internal temperature is relatively higher than a predetermined temperature.

8. The semiconductor device of claim 7, wherein the mode signal generator comprises:
- a bank active signal generator suitable for generating a bank active signal in response to the command signals and the address signals; and
- a signal synthesizer suitable for generating an enabled mode signal in the predetermined mode in response to the bank active signal.

9. The semiconductor device of claim 7, wherein a plurality of bits includes the temperature code signal, the temperature code signal having a logic level combination corresponding to a value of an internal temperature.

10. The semiconductor device of claim 7, wherein the temperature signal generator is suitable for generating the temperature signal according to the internal temperature detected from the temperature code signal when the mode signal is enabled, and latching the temperature signal when the mode signal is disabled.

11. The semiconductor device of claim 7, wherein the first power control signal is enabled when the temperature signal is at a first logic level and disabled when the temperature signal is at a second logic level.

12. The semiconductor device of claim 7,
- wherein the sense amplifier circuit is suitable for generating the first power signal having a second drive voltage in response to a second power control signal during a first time period following a selection of a memory cell by a word line;
- wherein the sense amplifier circuit is suitable for generating the first power signal having a third drive voltage in response to a third power control signal during a second time period following an end of the first time period; and
- wherein the sense amplifier circuit is suitable for generating the first power signal having the first drive voltage in response to the first power control signal during a third time period following an end of the second period.

13. The semiconductor device of claim 12, wherein the first drive voltage is relatively higher than the second drive voltage and the second drive voltage is relatively higher than the third drive voltage.

14. A semiconductor system comprising:
- a controller suitable for generating command signals, address signals and a temperature signal; and
- a semiconductor device suitable for generating a mode signal in response to the command signals and the address signals, generating a first power control signal in response to the mode signal and the temperature signal, and sensing and amplifying a voltage level of a bit line using a first power signal having a first drive voltage based on a use of the first power control signal as a power supply voltage, wherein a level of the temperature signal is changed when an internal temperature is relatively higher than a predetermined temperature.

15. The semiconductor system of claim 14, wherein the first power control signal is enabled when the temperature signal is at a first logic level, and disabled when the temperature signal is at a second logic level.

16. The semiconductor system of claim 14, wherein the semiconductor device comprises:
- a temperature signal latch unit suitable for latching the temperature signal in response to the enabled mode signal enabled in a predetermined mode and generating the temperature signal as a temperature latch signal;
- a power control signal generator suitable for generating the first power control signal as an enabled first power control signal in response to the temperature latch signal; and
- a sense amplifier circuit suitable for sensing and amplifying the voltage level of the bit line using the first power signal having the first drive voltage based on the use of the first power control signal as a power supply voltage.

17. The semiconductor device of claim 16, wherein an active operation is not applied to all banks in the predetermined mode.

18. The semiconductor system of claim 16, wherein the semiconductor device further comprises:
- a bank active signal generator suitable for generating a bank active signal in response to the command signals and the address signals; and
- a signal synthesizer suitable for generating the mode signal as an enabled mode signal in the predetermined mode in response to the bank active signal.

19. The semiconductor system of claim 16,
- wherein the sense amplifier circuit is suitable for generating the first power signal having a second drive voltage in response to a second power control signal during a first time period following a section of a memory cell by a word line;

wherein the sense amplifier circuit is suitable for generating the first power signal having a third drive voltage in response to a third power control signal during a second time period following an end of the first time period; and wherein the sense amplifier circuit is suitable for generating the first power signal having the first drive voltage in response to the first power control signal during a third time period following an end of the second period.

20. The semiconductor system of claim 19, wherein the first drive voltage is relatively higher than the second drive voltage and the second drive voltage is relatively higher than the third drive voltage.

21. The semiconductor device of claim 14, wherein a plurality of bits includes the temperature code signal, the temperature code signal having a logic level combination based on a value of an internal temperature.

* * * * *